United States Patent [19]
Gulla et al.

[11] Patent Number: 4,810,333
[45] Date of Patent: Mar. 7, 1989

[54] ELECTROPLATING PROCESS

[75] Inventors: Michael Gulla, Millis, Mass.; Donald F. Foust, Scotia, N.Y.; George K. Philipose, Waltham, Mass.

[73] Assignee: Shipley Company Inc., Newton, Mass.

[21] Appl. No.: 132,175

[22] Filed: Dec. 14, 1987

[51] Int. Cl.$^4$ .......................... C25D 5/02; C25D 5/56
[52] U.S. Cl. ........................................ 204/15; 204/20; 204/30
[58] Field of Search ...................... 204/15, 20, 24, 26, 204/30

[56] References Cited

U.S. PATENT DOCUMENTS 3,099,608  7/1963  Radovsky et al. .................. 204/15
3,533,918  10/1970  Smith ................................... 204/30

FOREIGN PATENT DOCUMENTS 2123036  1/1964  United Kingdom .

Primary Examiner—T. M. Tufariello
Attorney, Agent, or Firm—Robert L. Goldberg

[57] ABSTRACT

A method for metal plating the surface of an article formed from an organic plastic. The method includes a step of passing a current between two electrodes immersed in an electrolyte containing dissolved plating metal. One of the electrodes is the article to be plated and is provided with a surface having areas of a transition metal sulfide adjacent to and in contact with conductive areas. The method is especially useful for the formation of printed circuit boards and is sufficiently versatile to permit formation of a printed circuit board by a process that involves pattern plating.

58 Claims, No Drawings

ELECTROPLATING PROCESS

BACKGROUND OF THE INVENTION

I. Introduction

This invention relates to electroplating nonconductors, and more particularly, to a process for electroplating the surface of a nonconductor utilizing a chemisorbed, nonmetallic, conversion coating as a base for direct electroplating. The invention is particularly useful in the manufacture of printed circuit boards where copper is deposited over a circuit board base material.

II. Description of the Prior Art

Non conductive surfaces are conventionally metalized by a sequence of steps comprising catalysis of the surface of the nonconductor to render the same catalytic to an electroless metal deposit followed by contact of the catalyzed surface with an electroless plating solution that deposits metal over the catalyzed surface in the absence of an external source of electricity. Metal plating continues for a time sufficient to form a metal deposit of the desired thickness. Following electroless metal deposition, the electroless metal deposit is optionally enhanced by electrodeposition of a metal over the electroless metal coating to a desired full thickness. Electrolytic deposition is possible because the electroless metal deposit serves as a conductive coating that permits electroplating.

Catalyst compositions used for electroless metal plating are known in the art and disclosed in numerous publications including U.S. Pat. No. 3,011,920, incorporated herein by reference. The catalysts consist of an aqueous suspension of a tin noble or precious (catalytic) metal colloid. Surfaces treated with such catalysts promote the generation of electrolessly formed metal deposits by the oxidation of a reducing agent in an electroless plating solution catalyzed by the catalytic colloid.

Electroless plating solutions are aqueous solutions containing dissolved metal and reducing agent in solution. The presence of dissolved metal and reducing agent together in solution results in plate out of metal in contact with a catalytic metal tin catalyst. However, the presence of the dissolved metal and reducing agent together in solution can also result in solution instability and indiscriminate deposition of metal on the walls of containers for such plating solutions. This may necessitate interruption of the plating operation, removal of the plating solution from the tank and cleaning of tank walls and bottoms by means of an etching operation. Indiscriminate deposition may be avoided by careful control of the plating solution during use and by the use of stabilizers which inhibit indiscriminate deposition, but which also retard plating rate.

Attempts have been made in the past to avoid the need for an electroless plating solution by a direct plating process whereby a metal may be deposited directly over a treated nonconductive surface. One such process is disclosed in U.S. Pat. No. 3,099,608, incorporated herein by reference. The process disclosed in this patent involves treatment of the nonconductive surface with a tin palladium colloid which forms an essentially nonconductive film of colloidal palladium particles over the nonconductive surface. This is the same tin palladium colloid used as a plating catalyst for electroless metal deposition. For reasons not fully understood, it is possible to electroplate directly over the catalyzed surface of the nonconductor from an electroplating solution though deposition occurs by propagation from a conductive surface. Therefore, deposition begins at the interface of a conductive surface and the catalyzed nonconductive surface. The deposit grows epitaxially along the catalyzed surface from this interface. For this reason, metal deposition onto the substrate using this process is slow. Moreover, deposit thickness is uneven with the thickest deposit occurring at the interface with the conductive surface and the thinnest deposit occurring at a point most remote from said interface.

An improvement in the process of U.S. Pat. No. 3,099,608 is disclosed in U.K. Patent No. 2,123,036B, incorporated herein by reference (hereafter the "U.K. patent"). In accordance with the process described in the U.K. patent, a surface is provided with metallic sites and the surface is then electroplated from an electroplating solution containing an additive that is said to inhibit deposition of metal on the metal surface formed by plating without inhibiting deposition on the metallic sites over the nonconductive surface. In this way, there is said to be preferential deposition over the metallic sites with a concomitant increase in the overall plating rate. In accordance with the patent, the metallic sites are preferably formed in the same manner as in the aforesaid U.S. Pat. No. 3,099,608—i.e., by immersion of the nonconductive surface in a solution of a tin palladium colloid. The additive in the electroplating solution responsible for inhibiting deposition is described as one selected from the group of dyes, surfactants, chelating agents, brighteners and leveling agents. Many of such materials are conventional additives for electroplating solutions.

There are disadvantages to the above process. Both the processes of the U.S. and the U.K. patents for direct electroplating require conductive surfaces for initiation and propagation of the electroplated metal deposit. For this reason, the processes are limited in their application to metal plating of nonconductive substrates in areas in close proximity to a conductive surface.

One commercial application of the process of the U.K. patent is the metallization of the walls of through holes in the manufacture of double-sided printed circuit boards by a process known in the art as panel plating. In this application, the starting material is a printed circuit board substrate clad on both of its surfaces with copper. Holes are drilled through the printed circuit substrate at desired locations. For conductivity, the hole walls are catalyzed with a tin palladium colloid to form the required metallic sites on the surfaces of the walls of the through holes. Since the circuit board material is clad on both of its surfaces with copper and the circuit board base material is of limited thickness, the copper cladding on the surfaces of the circuit board material is separated by the thin cross section of the substrate material. The next step in the process is direct electroplating over the catalyzed hole walls. Since the copper cladding on each surface is separated by the cross section of the substrate, during electroplating, deposition initiates at the interfaces of the copper cladding and the through hole walls and rapidly propagates into the holes. The hole wall is plated to desired thickness within a reasonable period of time. Thereafter, the circuit board is finished by imaging and etching operations.

A disadvantage to the above panel plating process is that copper is electroplated over the hole wall and over the entire surface of the copper cladding. The steps following plating involve imaging and removal of copper by etching. Therefore, copper is first electrolytically deposited and then removed by etching, a sequence of steps which is wasteful of plating metal, etchant and time, and therefore, more expensive.

The art, recognizing the disadvantages of panel plating, has developed a method for manufacture of printed circuit boards known as pattern plating. In this process, a printed circuit board base material is drilled at desired locations to form through holes. The through holes are metalized using conventional electroless plating techniques. Electroless copper is plated onto the walls of the through holes and over the copper cladding. Thereafter, photoresist is applied and imaged to form the circuit pattern. The board is then electroplated with copper with copper depositing on the copper conductors and through hole walls, but not over the entire surface of the copper cladding. An etch resist is then applied over the exposed copper by immersion or electroplating and the remaining photoresist is stripped. The copper not protected by the resist mask is then removed by etching to form the copper circuit.

Pattern plating cannot be used with the metalizing process of the aforesaid U.K. patent. The treatment of the copper cladding prior to the application of the photoresist and the development of the photoresist, all as required for pattern plating, requires the use of treatment chemicals found to dissolve or desorb the tin palladium colloid from hole walls. Since this occurs prior to electroplating, direct electroplating to provide conductive through holes becomes impossible.

SUMMARY OF THE INVENTION

The present invention provides a new method for direct electroplating of the surface of a nonconductor and to articles manufactured by said method. The process is an improvement over the process of the above referenced U.K. patent.

The invention disclosed herein is predicated upon a combination of discoveries. One discovery is that thin nonmetallic films, believed to be semiconductor conversion coatings, possess adequate conductivity to permit direct electroplating over the film. A second discovery of the invention is that the conversion coatings of the invention are unaffected by treatment chemicals used for plating of plastics and circuit board fabrication. A third discovery of the invention is that conversion coatings of the type described herein may be formed over and bonded to the surface of a nonconductor by substitution of several novel treatment solutions for conventional treatment solutions used in a typical plating process for the manufacture of printed circuit boards.

The process of the invention is illustrated by the plating sequence that follows. The process illustrated comprises a preferred process using sulfide conversion coatings and is compared to one plating process frequently used in printed circuit board manufacture.

|  | Conventional Process | Inventive Process |
| --- | --- | --- |
| Step 1 | Swell surface by organic pretreatment (optional) | Swell surface by organic pretreatment (optional) |
| Step 2 | Condition with permanganate solution | Condition with permanganate solution |
| Step 3 | Neutralize residues | — |
| Step 4 | Clean and condition | — |
| Step 5 | Etch copper cladding | — |
| Step 6 | Catalyst predip | Acid dip |
| Step 7 | Catalyze with tin palladium colloid | Treat with sulfide solution |
| Step 8 | Accelerate | Treat with metal ion solution |
| Step 9 | Deposit electroless metal | Etch copper cladding |
| Step 10 | Electroplate | Electroplate |

A comparison of the two processes illustrated above demonstrates that the process of the subject invention replaces the need for electroless plating with a direct electroplating step. In addition, the process of the invention is advantageous in that it requires fewer processing steps thereby permitting increased through put in a plating line. Further, the process of the subject invention eliminates the need for costly tin palladium colloid solution and substitutes therefor an inexpensive sulfide treatment solution. Finally, as will be more fully explained below, the process of the invention provides a conversion coating that is believed to be a semiconductor film chemisorbed onto the surface of the nonconductor which film has been found to be unaffected by conventional processing chemicals used for metal plating of plastics and formation of printed circuit boards.

In the preferred process of the subject invention illustrated above, the sulfide solution (Step 7) may be a simple aqueous solution of a water soluble metal sulfide. For reasons not fully understood, contact of the sulfide solution with manganese residues retained on the surface of the nonconductor from the permanganate treatment results in the formation of a nonconductive sulfide coating over the surface of the nonconductor. For this reason, in the practice of the process of the subject invention, and in contrast to the standard process illustrated above, it is desirable that the step of neutralization (Step 3), typically employed to remove manganese residues from the surface of the nonconductor prior to further processing, be eliminated.

The sulfide film formed by contact of the manganese residues with the sulfide treatment solution is believed to be manganese sulfide. The manganese residues following permanganate treatment are oxides and it is believed that oxygen is replaced by sulfur to form manganese sulfide. The film of manganese sulfide does not appear to function as a suitable conversion coating for direct electroplating.

For direct electroplating in accordance with the invention, the manganese sulfide film is converted to a conversion coating, believed to be a semiconductor film, that will support direct electroplating. This may be accomplished by contact with a solution of a metal ion that reacts with the sulfide to form the conversion coating of the invention. Group IB and VIII metals are preferred. Copper and nickel ionic solutions are most preferred. The metal ion solution need not be a solution of a noble metal as required for electroless metal deposition processes.

For the formation of printed circuit boards using the process of the subject invention, it is preferred that an etching step be used subsequent to formation of the conversion coating over the surface of the nonconductor (Step 9 above). This etching step may use the same etchants as used in the conventional process to clean copper cladding (Step 5 above). It is preferred that the etching step be deferred to a point subsequent to the step of formation of the conversion coating so that the etchant may remove residues on the surface of the copper cladding. It is an unexpected advantage of the subject invention that the conversion coating over the nonconductive surface is virtually unaffected by the step of etching the copper cladding.

The final step in the process of the subject invention comprises electroplating of the thin conversion coating. This is accomplished using standard electroplating procedures. The procedures of the above referenced U.K. Patent are suitable for electroplating the sulfide coating described herein.

DEFINITIONS

The term "non conductor" means an article having at least a portion of its surface inadequately conductive for direct electroplating. The non conductor must be in contact with a metal surface which can be a part of the non conductor or which can be placed in contact with the non conductor for electroplating. In the preferred embodiment of the invention, the term "non conductor" refers to a printed circuit board base material such as a copper clad epoxy or phenol sheet.

The term "U.K. Patent" means U.K. Patent No. 2,123,036B.

The term "semiconductor" as from time to time used in association with the term conversion coating is used to mean a material with an electrical conductivity greater than that of an insulator or a dielectric, but far less than the conductivity of true conductor such as a metal. As is known in the art, the conductivity of a semiconductor arises from impurities that provide either loosely bound electrons than can move and carry current, or impurities that remove electrons from their normal place in the lattice and so form a hole which can be filled by an adjacent electron whose movement creates a new hole which in turn is filled. For purposes herein, a preferred range of conductivity for the semiconductor is from about $10^{-3}$ to $10^{-8}$ mhos/cm. The term semiconductor is used herein based upon the belief that the conversion coatings formed herein are semiconductors, but this explanation is offered as a theoretical explanation without intent of being bound thereby.

DESCRIPTION OF THE PREFERRED EMBODIMENTS

The subject invention is suitable for manufacture of a variety of commercial articles where a metal deposit is desired over the surface of a nonconductor. However, the invention is especially useful for the fabrication of printed circuit boards. For this reason, the description that follows is directed primarily to printed circuit board manufacture.

A recent trend in the printed circuit board industry is to use a permanganate conditioner in the fabrication sequence. Though desirable, it is optional. The description which follows illustrates the process of the subject invention without permanganate treatment though it should be recognized that permanganate treatment may be used and the advantages of permanganate treatment will be realized if incorporated into the process of the invention. Details of permanganate treatment can be found in U.S. Pat. No. 4,515,829, incorporated herein by reference.

In printed oircuit board manufacture, the substrate commonly used is an epoxy substrate filled with glass fibers and copper clad on at least one of its surfaces. As is known in the art, the epoxy can be substituted or mixed with other resins for specific purposes.

In the manufacture of a double-sided printed circuit board, a first step comprises the formation of through holes by drilling or punching or any other method known to the art. Following formation of the holes, it is desirable to employ the conventional steps of desmearing the holes (Step 1 above) by sulfuric acid, chromic acid or plasma etching or etchbacking the holes with chromic acid, followed by glass etching. Thereafter, the processing sequence of the subject invention may be employed.

Following desmearing or etchback of the holes, the circuit board base material is conventionally treated with a glass etch that removes glass fibers extending into the holes from the hole walls. This is followed by a solution that cleans the copper surface and conditions the hole wall to promote catalyst absorption. Such solutions are often referred to as cleaner conditioners and typically comprise an aqueous alkaline surfactant solution for cleaning soil and a quaternary amine to condition the hole wall. This treatment step, by itself, is old in the art and does not constitute a part of the invention. proprietary cleaner conditioners are commercially available and a suitable material is available from Shipley Company Inc. of Newton, Mass. and identified as Cleaner Conditioner 1175.

With reference to the processing sequence set forth above, the first step in accordance with the invention comprises treatment of the walls of the holes with a solvent, preferably an oxygenated epoxy solvent selected from the group of ketones, ethers and ether alcohols. Preferred solvents, by way of example, include acetone, methylethyl ketone, Methyl Cellosolve, Butyl Carbitol, Butyl Carbitol acetate, Butyl Cellosolve and Butyl Cellosolve acetate. The epoxy solvent may be used as a 100% solution, but is preferably an alkaline aqueous solution to decrease the attack on the surface of the epoxy. Preferably, the solvent is diluted with water whereby the solvent comprises from 10 to 70% of the solution and more preferably, from 15 to 40% of the solution. The solvent solution is preferably an alkaline solution having an alkaline normality of from 0.05 to 0.80 normal and more preferably, from 0.10 to 0.5 normal. Any source of alkalinity is suitable, hydroxides and amines being preferred. The solution is preferably used at an elevated temperature of at least 110° F. and preferably at a temperature ranging between about 130° F. and 165° F. The time of contact with the solvent solution is dependent upon the strength of the solvent used and its temperature. Typically, treatment time may vary from 1 minute to 10 minutes and more conventionally, varies from about 3 to 8 minutes.

Following contact of the circuit board base material with the solvent as described above, the part is rinsed and treated with a permanganate solution. The permanganate solution used is one having a pH in excess of 10 and preferably in excess of 13. The higher pH provides increased bond strength between a subsequently deposited metal plate and the nonconductive surface. Accordingly, in the most preferred embodiment of the invention, the pH of the permanganate solution ranges between about 13.1 and 13.6. In addition, harsh treatment conditions are desirable with the permanganate solution being maintained at an elevated temperature, preferably in excess of 140° F., and preferably ranging between 165° F. and 200° F. The immersion time in the permanganate solution may vary from about 2 to 20 minutes, and preferably varies between about 3 and 10 minutes.

Any metal salt of permanganate that is stable and soluble to the extent that at least two grams per liter in water can be used to form the permanganate treatment solution though it is preferred to use an alkali metal salt, e.g., a salt of potassium, sodium or lithium, cesium, etc. or an alkaline earth metal salt, e.g., a salt of calcium, etc. Especially preferred because of ready availability, reasonable cost and good solubility are sodium and potassium permanganates. The concentration of the permanganate preferably varies between 10 and 100 per liter and more preferably, between 20 and 50 grams per liter. The pH of the permanganate solution is controlled by addition of a base. A suitable base is a hydroxide having a common ion with a permanganate salt. Sodium and potassium hydroxides are preferred.

The steps of treatment with the solvent and permanganate solutions are conventional treatment steps in the prior art and are described in U.S. Pat. No. 4,515,829, incorporated herein by reference. The solvent treatment step is optional in accordance with the subject invention but is a desirable step as it contributes to bond strength between the surface of the nonconductor and the subsequently deposited metal layer.

Treatment with a permanganate solution is believed to form a manganese oxide coating chemisorbed onto the surface of the nonconductor. Identity of the coating has been confirmed by electron dispersive X-ray testing which involves bombardment of the surface to be examined with X-rays to obtain a characteristic curve that identifies the elements comprising the surface.

In the prior art, the next step in the process of printed circuit board manufacture would be the treatment of the surface with a solution identified by the art as a Neutralizer solution. Neutralizer solutions used are aqueous solutions of reducing agents intended to remove excess permanganate residues from the surface of the nonconductor. In accordance with the subject invention, though a step of neutralization may be employed, it is desirable to eliminate this step because a heavy layer of manganese residue on the surface of the nonconductor is believed to promote the formation of the desired conversion coating.

The next step in the process of the subject invention is optional and may be used if the nonconductor is clad with a metal such as copper as would be used for the fabrication of circuit boards. If the surface of the nonconductor is clad with copper, it may be contacted with a mild etching solution to remove copper oxide from the surface of the cladding. The solution used is one that removes the residues from the cladding without attacking the surface of the nonconductor. For this reason, it is distinguishable from a Neutralizer conventionally used following permanganate conditioning. A suitable etching solution is a mild aqueous acid solution such as a sulfuric acid solution in a concentration of from about 5 to 25% by weight. Room temperature treatment is preferred for a time sufficient to remove the residue from the cladding. From 1 to 5 minutes immersion is sufficient.

Following mild etching, the conversion coating is formed. A preferred method for formation of the conversion coating involves formation of a sulfide. This is accomplished by the chemical conversion of the permanganate residue layer, believed to be a layer of manganese oxide, to a layer believed to be manganese sulfide. Sulfide formation occurs by contact of the manganese oxide residue layer with a solution of a sulfide salt. It is believed that sulfur replaces oxygen and forms a yellow sulfide. The identity of the layer as manganese sulfide was confirmed by electron dispersive X-ray testing and will be discussed in greater detail in the Examples which follow.

The sulfide treatment solution is one comprising a sulfide preferably dissolved in a suitable solvent. For metal plating operations, aqueous solutions are preferred and in accordance with a preferred embodiment of the invention, an aqueous solution of a water soluble sulfide salt may be used. Alkali and alkaline earth metal salts are suitable. Sodium, potassium and lithium sulfides are preferred. Ammonium sulfide may also be used.

The sulfide salt concentration is not critical. Satisfactory results have been obtained with relatively low sulfide concentrations. The concentration of the sulfide in solution may vary from a relatively low concentration such as 0.1 gram per liter to the solubility limit of the salt. A preferred concentration for the sulfide in solution varies from about 1.0 to 15 grams per liter of solution, and most preferably, from about 1 to 5 grams per liter of solution. The solutions are preferably alkaline to prevent generation of hydrogen sulfide gas though acid solutions may be used. A pH in excess of 8 is preferred with a more preferred range of pH varying from about 9 to 12.

When the process of the subject invention is used to prepare a metal clad non conductor for electroplating, problems have been encountered using a sulfide salt solution as described above. The problem has arisen as a consequence of contact of sulfide ions with the metal cladding. This results in the formation of a metal sulfide over the surface of the cladding—i.e., copper sulfide when the nonconductor is a copper clad printed circuit board base material. The copper sulfide formed is a dense, black layer that is insoluble in common etchants but can nonetheless be removed from the copper surface to which it is not firmly adhered using conventional procedures such as scrub cleaning. The copper sulfide surface prevents copper to copper bonding during subsequent electroplating processes as is conventional in printed circuit board formation.

In accordance with a most preferred embodiment of the invention, it is an unexpected discovery of the invention that copper sulfide formation can be reduced when the sulfide solution is one where the sulfur is covalently bonded such as the covalent bond between carbon and sulfur. A metal thiocarbonate solution is an example of a suitable covalently bonded sulfide compound. Dithiodiglycolic acid, sodium thiocarbonate and potassium thiocarbonate are preferred examples of sulfides in accordance with this embodiment of the invention. They are used in concentrations and under conditions equivalent to those set forth above for the simple sulfide solutions.

Regardless of whether a simple sulfide or a covalently bonded sulfide solution is used, treatment with the sulfide solution results in conversion of the layer of manganese residues to a yellow conversion coating. The yellow conversion coating has not been found to be suitable for direct electroplating and must be further reacted by treatment with a solution of a metal that is believed to be a semiconductor precursor in contact with the manganese sulfide. This metal is preferably selected from Groups IA, IB and VIII of the Periodic Table of the Elements. It is believed that this treatment results in replacement of the majority of the manganese by the metal of the treatment solution resulting in the formation of a metal sulfide conversion coating. This is verified by electron dispersive X-ray testing.

The metal salt solution used is preferably a solution of a cobalt, nickel, copper or iron salt, copper and nickel being most preferred. The anion of the salt is not critical provided it does not interfere with replacement of manganese by the metal, and further, provided that the anion does not interfere with the subsequent plating reaction. Sulfates are preferred and nickel sulfate is the most preferred salt for purposes herein.

The concentration of the metal in aqueous solution is not critical. Solutions containing the metal salt in concentrations of from 1% by weight to the solubility limit of the salt are satisfactory. The preferred concentration ranges from about 5 to 25% by weight of solution. Treatment conditions are routine with room temperature being satisfactory using treatment times ranging between 1 and 10 minutes. The conversion coating so formed is black and is believed to be sufficiently conductive for direct electroplating. It is firmly bonded to the surface of the non conductor and resists attack from treatment solutions typically used in the manufacture of printed circuit boards.

Treatment with the metal treatment solution as described above results in the formation of an article of manufacture comprising a nonconductor having at least portions of its surface coated with the conversion coating which conversion coating is believed to be a semiconductor. For direct electroplating, the conversion coating is in contact with a metal surface. In this respect, if the article is printed circuit base material, it would typically comprise a nonconductor substrate having metallic cladding such as copper and unclad surfaces in contact with the metallic cladding coated with the conversion coating. For example, the conversion coating would typically be disposed over the walls of through holes though it should be understood that it would also be coated over the metallic cladding.

Following formation of the conversion coating as described above, the nonconductor may be directly electroplated. If the nonconductor is a copper clad printed circuit base material, the copper cladding should be cleaned such as, for example, by use of a sulfuric acid-hydrogen peroxide pre-etch, for example, Preposit ® 746 etchant available from Shipley Company Inc. of Newton, Mass. The etchant may be used at room temperature for a period of time ranging between 1 and 3 minutes. It should be noted that unexpectedly, treatment with the etchant does not result in attack upon the conversion coating of the invention.

The next step in the process of the invention comprises electroplating directly over the conversion coating avoiding the intermediate step of electroless metal plating. The electroplating procedure is similar to the procedure disclosed in the above referenced U.K. Patent, but careful control of the electroplating parameters as required in the process of the U.K. Patent is not necessary in the process of this invention. The electroplating process may use electroplating solutions such as those disclosed in the U.K. Patent, but most commercially available electroplating solutions contain additives which make most commercially available electroplating solutions suitable for the process of the invention. The preferred eectroplating metals in accordance with the invention are copper and nickel though the process is suitable for electroplating of any desired metal. A typical electroplating solution comprises an aqueous acid solution of the metal desired to be plated together with proprietary additives from the groups of dyes, surfactants, chelating agents, brighteners, leveling agents, etc. Typical acids used in the formulation of said baths comprise those with a high ionic dissociation constant for maximum conductivity such as sulfuric acid, fluoroboric acid, sulfamic acid, etc. Dyes typically used in such baths include methylene blue, methyl violet, and other N-heterocyclic compounds; triphenyl methane type dyes and aromatic amines, imines and diazo compounds. Suitable surfactants included in such baths typically include non-ionic surfactants such as alkylphenoxy polyethoxyethanols, e.g., octylphenoxy, polyethoxyethanol, etc. Surfactants include wetting agents and water soluble organic compounds such as compounds containing multiple oxyethylene groups have been found to be effective. A preferred group of said compounds include polyoxyethylene polymers having from as many as 20 to 150 repeating units. Also included in this class of materials are block copolymers of polyoxyethylene and polyoxypropylene. The additives described above are added to the solution in conventional concentrations.

The electroplating procedure is conventional. The part to be plated is used as a cathode in a conventional electroplating cell. Current density is conventional and varies typically within a range of from 1 through 10 amps per $dm^2$. Theoretically, a low initial current density should be preferred with current density increased as an initial deposit is formed. This would be expected to prevent burn off of the thin conversion coating. However, in practice, adverse results caused by a high initial current density have not been observed. A preferred current density range is from 2 to 5 amps per $dm^2$. The plating solution is maintained at a temperature ranging between room temperature and about 100° F. Plating is continued for a time sufficient to form a deposit of desired thickness. For circuit board manufacture, a desired thickness may range between 0.5 and 2.0 mils, typically from 1 to 1.5 mils. A plating time of from 45 to 90 minutes would typically be required to obtain a deposit of the preferred thickness within the preferred range of current densities. The deposit formed by the process is uniform in thickness, free of defects and strongly bonded to the surface of the nonconductor over which it is plated. Bond strength is satisfactory to withstand solder shock testing as conventionally used in printed circuit board manufacture.

The bond between the conversion coating and the nonconductor and the chemical resistance of the conversion coating to treatment solutions permits simplified printed circuit board manufacturing processes impractical or inoperative in the prior art. For example, a pattern plating sequence, as described above, could not be used with the direct electroplating process of the U.K. Patent because the pretreatment steps would remove or dissolve adsorbed colloid thereby making it impossible to first treat and image and then electroplate. This is a serious disadvantage because it severely limits the type of circuit board that can be fabricated using the process of the U.K. Patent. The conversion coating of the subject invention remains unaffected when contacted with treatment chemicals required for pattern plating. Therefore, a pattern plating process for formation of printed circuit boards is possible using the process of the subject invention. Such a process is illustrated in the sequence of steps described below using a predrilled and desmeared copper clad circuit board base material:

|  | Pattern Plating Sequence |
| --- | --- |
| Step 1 | Swell surface by organic pretreatment (optional) |
| Step 2 | Condition with permanganate solution |
| Step 3 | Acid dip |
| Step 4 | Treat with sulfide |
| Step 5 | Treat with metal ion solution |
| Step 6 | Apply and image photoresist |
| Step 7 | Develop photoresist image |
| Step 8 | Acid clean copper cladding |
| Step 9 | Microetch copper cladding |
| Step 10 | Electroplate |
| Step 11 | Apply solder resist |
| Step 12 | Remove remaining photoresist |
| Step 13 | Remove copper bared by removal of photoresist. |

Step 5 above results in the formation of the conversion coating of the invention. Pattern plating is possible in accordance with the invention because the etchants and alkaline developers used to develop the photoresist layer do not adversely effect or inactivate the conversion coating. These same developers would inactivate, desorb or dissolve the palladium tin colloidal coating used for direct electroplating in the process of the U.K. Patent.

The invention will be better understood by reference to the Examples which follow where, unless stated otherwise, the substrate treated was an epoxy copper clad circuit board base material provided with a random array of through holes and commercial formulations are available from Shipley Company Inc. of Newton, Mass.

EXAMPLES 1 TO 5

The following examples illustrate the formation of a sulfide conversion coating followed by electroplating.
Step 1 Clean and condition circuit board base material:
  a. clean the circuit board with Scrub Cleaner 11 and water rinse;
  b. immerse the cleaned board in an organic solvent for the board identified as Conditioner 212 at 150° F. for 7 minutes. Rinse the board for 3 minutes in clear water;
  c. condition the swelled board with Promoter 213 permanganate solution at 175° F. for 15 minutes to form a black coating believed to be manganese oxide and rinse the board for 3 minutes in clear water;
  d. clean the copper surfaces to remove any oxides by dipping the permanganate treated board in a 10% solution of sulfuric acid at room temperature for 2 minutes and water rinse for 2 minutes.
Step 2 Form sulfide conversion coating:
  a. immerse the cleaned board in a room temperature sulfide solution a identified in Table 1 below for 5 minutes and rinse for 2 minutes to convert the black manganese oxide coating to a yellow coating and water rinse;
  b. immerse the coated board in a room temperature solution containing metal ions as set forth below in Table 1 for 5 minutes. Water rinse for 2 minutes to form a black conversion believed to be a transition metal sulfide.

Sulfide solutions used in the Examples are described in the following table where for each example, the concentration of the sulfide in solution was 10 grams per liter except in Example 5 where a neat solution was used.

TABLE 1

| Example Number | Sulfide | Solution pH | pH adjustor |
| --- | --- | --- | --- |
| 1 | sodium sulfide | 12–12.5 | NaOH |
| 2 | sodium thiocarbonate | 12–12.5 | NaOH |
| 3 | sodium diethyl-dithiocarbamate | 12–12.5 | NaOH |
| 4 | sodium dithiodiglycolic acid | 12–12.5 | NaOH |
| 5 | carbon disulfide | NA | NA |

Boards prepared in accordance with the preceding were observed for appearance. All boards are seen to be completely coated on all surfaces and in the through holes with dark brown to black metallic film. The board treated with sodium sulfide (Example 1) has a very thick coating while boards made using the sulfide solutions of Examples 2 through 5 possess a thinner coating.

The above prepared boards having a sulfide conversion coating may be electroplated using the procedures of steps 3 and 4 as follows:
Step 3 Remove conversion coating from copper: immerse the coated board in a peroxide sulfuric etchant identified as Pre-Etch 746 etchant at a temperature of 110° F. for 1 minute and water rinse.
Step 4 Microetch copper surfaces: immerse the board in a persulphate etchant (¼ lb./gallon) identified as Pre-Etch 748 at 70° F. for 1 minute and water rinse.
Step 5 Electroplate:electroplate copper from an acid copper electroplating bath identified as Electroposit ® 892 acid copper at a current density of 30 amps/sq. ft. and at a temperature of 70° F. for 3 minutes and water rinse.

Treatment of Example 1 boards with the peroxide etchant (step 5) resulted in large flakes of precipitate floating in the bath. The origin of this material is the film on the copper surface. The film can be seen lifting off the copper surfaces when the board is immersed in the bath and large flakes of the insoluble material are seen in the bath. When the boards of Examples 2 to 5 are immersed in the peroxide etchant, precipitate would also appear, but to a much lesser extent. In all cases, copper plated onto the walls of the through holes and onto the copper cladding would exhibit excellent bond strength.

Examples 1 and 2 constitute the most preferred embodiments of the direct electroplating process of the invention even though Example 1 requires cleaning of the heavier sulfide coating.

EXAMPLES 6 AND 7

These examples demonstrate a process for panel plating. Boards would be prepared following the procedures defined in steps 1 through 5 above using the sodium sulfide solution of Example 1 (Example 6) and the sodium thiocarbonate solution of Example 2 (Example 7). Following electrolytic deposition over the sulfide conversion coating, the following steps would be used:
Step 6 Apply and image photoresist:
  a. dry the cleaned boards;
  b. apply a dry film of Riston ® 3015 photoresist (available from E. I. DuPont de Nemours and Company of Wilmington, Del.) at an application temperature of between 98° and 110° C. and at a speed of from 1 to 3 ft/min. and wait 15 minutes following application of the film; and c. expose the film to a source of activating energy to obtain the desired circuit pattern at an exposure of 40 mJ/cm and then wait 15 minutes.

Step 7 Develop imaged photoresist: place the imaged board in a spray chamber using a solution consisting of 5 pounds of sodium carbonate and 1 gallon of butyl carbitol per 60 gallons and develop at a temperature of 85° F. for 1 minute.

Step 8 Electroplate solder: immerse the substrate in a tin/lead fluoroborate plating solution identified as Electroposit 280 Tin/Lead at a temperature of 85° F. using a cathode current density of between 10 and 40 amps/sq. ft. for 60 minutes.

Step 9 Remove photoresist: spray the board with a 2% potassium hydroxide solution at a temperature of 85° F. for 1 minute.

Step 10 Etch copper: Spray the board with an ammoniacal copper etchant at 110° F. until all of the exposed copper is removed.

In both examples, copper coverage over all surfaces including through holes would be expected to be excellent.

EXAMPLES 8 AND 9

The following examples demonstrate a hypothetical process for pattern plating in the formation of a printed circuit board using the process of the invention.

Boards may be prepared following the procedures defined in steps 1 through 3 of Examples 1 to 5 using the sodium sulfide solution of Example 1 (Example 8) or the sodium thiocarbonate solution of Example 2 (Example 9). Following formation of the sulfide conversion coating and the removal of sulfide coating from copper surfaces, the following step may be followed:

Step 4 Apply and image photoresist:
a. dry the cleaned boards;
b. apply a dry film of Riston ® 3015 photoresist available from E. I. DuPont de Nemours and Company of Wilmington, Del. at an application temperature of between 98° and 110° C. and at a speed of from 1 to 3 ft/min. and wait 15 minutes following application of the film; and
c. expose the photoresist film to a source of activating energy through a master to obtain the desired circuit pattern at an exposure of 40 mJ/cm and wait 15 minutes.

Step 5 Develop the photoresist: place the substrate in a spray chamber using a solution consisting of 5 pounds of sodium carbonate and 1 gallon of butyl carbitol per 60 gallons of developer and develop at a temperature of 85° F. for 1 minute.

Step 6 Clean copper: Immerse the sulfide coated board in Acid Cleaner 811 at 110° F. for 1 minute and water rinse.

Step 7 Microetch copper surfaces: Immerse the board in a persulphate etchant (¼ lb./gallon) identified as Pre-Etch 748 at a temperature of 70° F. for 1 minute and water rinse.

Step 8 Electroplate: electroplate copper from an acid copper electroplating bath identified as Electroposit ® 892 acid copper at a current density of 30 amps/sq. ft. and at a temperature of 70° F. for 30 minutes and water rinse.

Step 9 Electroplate solder: immerse the developed board in a tin/lead fluoroborate plating solution identified as Electroposit 280 Tin/Lead at a temperature of 85° F. using a cathode current density of between 10 and 40 amps/sq. ft. for 60 minutes.

Step 10 Remove photoresist: spray the board with a 2% potassium hydroxide at a temperature of 85° F. for 1 minute.

Step 11 Etch copper surfaces: spray the board with an ammoniacal copper etchant at 110° F. until all of the exposed copper is removed.

The above procedure would produce circuit boards with good copper to copper bonds. Example 9 would constitute the most preferred embodiment of the invention for formation of circuit boards using pattern plating procedures.

We claim:

1. A method for metal plating the surface of a nonconductor, said method comprising the step of passing a current between two electrodes immersed in an electrolyte containing dissolved plating metal, one of said electrodes comprising said nonconductor to be plated, said nonconductor having a surface comprising areas of a metal sulfide conversion coating capable of direct electrolytic deposition of metal adjacent to and in contact with conductive areas.

2. The method of claim 1 where the metal sulfide is a semiconductor.

3. The method of claim 1 where the conversion coating is a metal sulfide chemisorbed onto to the nonconductor.

4. The method of claim 1 where the metal sulfide is a sulfide of a Group I A, I B or Group VIII metal of the Periodic Chart of the Elements.

5. The method of claim 4 where the metal sulfide conversion coating is a sulfide of a member selected from the group of iron, cobalt, nickel and copper.

6. The method of claim 4 where the metal sulfide conversion coating is copper sulfide.

7. The method of claim 4 where the metal sulfide conversion coating is nickel sulfide.

8. The method of claim 1 where the electrolyte is a solution containing a dissolved metal selected from the group of copper and nickel.

9. The process of claim 8 where the dissolved metal is copper.

10. The method of claim 9 where the electrode comprising the nonconductor is a printed circuit board base material having copper cladding and the metal sulfide conversion coating is disposed over the surface of walls defining holes passing between the surfaces of said printed circuit board substrate material.

11. A method for metal plating the surface of an article formed from an organic plastic, said method comprising the step of passing a current between two electrodes immersed in an electrolyte containing dissolved plating metal, one of said electrodes comprising said article to be plated, said article having a surface comprising areas of a semiconductor conversion coating adjacent to and in contact with conductive areas.

12. The method of claim 11 where the conversion coating is a metal sulfide chemically bonded to the nonconductor and comprises a metal sulfide of a metal selected from Group I A, I B or Group VIII of the Periodic Chart of the Elements.

13. The method of claim 11 where the conversion coating is a sulfide of a member selected from the group of cobalt, nickel and copper.

14. The method of claim 11 where the metal sulfide is a nickel sulfide.

15. The process of claim 11 where the article is a printed circuit board base material.

16. A method for formation of a metal sulfide conversion coating over the surface of a nonconductor, said method comprising the steps of treating the surface of said nonconductive surface with an alkaline solution of a permanganate, treating the surface of the nonconductor with a solution containing a dissolved sulfide and treating said nonconductive surface with a solution of a dissolved metal ion capable of reacting with the so treated surface of the nonconductor to form an insoluble sulfide.

17. A method for formation of a metal sulfide conversion coating over the surface of a nonconductor, said method comprising the steps of:
   a. treating the surface of said nonconductor with an alkaline solution of a permanganate,
   b. treating the surface of the nonconductor with a solution containing a dissolved sulfide capable of reacting with the permanganate treated surface to form a manganese sulfide, and
   c. treating said nonconductor with a solution of a dissolved Group I B or Group VIII B metal ion capable of reacting with the manganese sulfide to form an insoluble sulfide of said Group I B or Group VIII B metal.

18. The method of claim 17 where the nonconductor is an organic polymer.

19. The method of claim 18 where the alkaline permanganate solution has a pH in excess of 10.

20. The method of claim 19 where the pH exceeds 13.

21. The method of claim 19 where the concentration of the permanganate in the alkaline permanganate solution varies between 10 and 100 grams per liter of solution.

22. The method of claim 19 where the permanganate solution is a solution of potassium permanganate.

23. The method of claim 18 where the solution used to form the manganese sulfide is a solution of an aqueous soluble metal sulfide salt.

24. The method of claim 18 where the solution used to form the manganese sulfide is a solution of an alkali or alkaline earth metal sulfide in a concentration of from 1 to 50 grams per liter of solution.

25. The method of claim 18 where the solution used to form the manganese sulfide is a solution of an alkali or alkaline earth metal sulfide.

26. The method of claim 18 where the solution used to form the sulfide is a solution of a Group I A, I B or Group VIII metal of the Periodic Chart of the Elements.

27. The method of claim 18 where the solution used to form the sulfide is a solution of an iron, cobalt, nickel or copper salt.

28. The method of claim 18 where the solution used to form the sulfide is a solution that forms a semiconductor metal sulfide.

29. A method for electroplating an article of manufacture comprising an electrically nonconductive body portion having a surface comprising metallic areas and non metallic polymeric areas adjacent to and in contact with each other, said method comprising the steps of:
   a. treating the surface of said article with an alkaline solution of a permanganate,
   b. treating the surface of the article with a solution containing a dissolved sulfide capable of reacting with the permanganate treated surface to form a manganese sulfide,
   c. treating said article with a solution of a dissolved metal capable of reacting with the manganese sulfide to form an insoluble semiconductor sulfide of said metal; and
   d. metal plating the surface of the article by passing a current between said article and an electrode immersed in an electrolyte containing dissolved plating metal.

30. The method of claim 29 where the alkaline permanganate solution has a pH in excess of 10.

31. The method of claim 29 where the permanganate solution is a solution of potassium permanganate.

32. The method of claim 28 where the solution used to form the manganese sulfide is a solution of an aqueous soluble metal sulfide salt.

33. The method of claim 28 where the solution used to form the manganese sulfide is a solution of an alkali or alkaline earth metal sulfide in a concentration of from 1 to 15 grams per liter of solution.

34. The method of claim 28 where the solution used to form the sulfide is a solution of a Group I A, I B or Group VIII metal of the Periodic Chart of the Elements.

35. The method of claim 28 where the solution used to form the metal sulfide is a solution of an iron, cobalt, nickel or copper salt.

36. The method of claim 28 where the solution used to form the sulfide is a solution of a copper salt.

37. The method of claim 28 where the article is plated with copper.

38. A method for manufacture of a printed circuit board starting from a printed circuit board base material comprising a copper clad phenolic or epoxy sheet having holes passing through the sheet at selected locations, said method comprising the steps of:
   a. treating the surface of said printed circuit board base material with an alkaline solution of a permanganate,
   b. treating the surface of said printed circuit board base material with a solution containing a dissolved sulfide capable of reacting with the permanganate treated surface to form a manganese sulfide,
   c. treating the surface of said printed circuit board base material with a solution of a dissolved metal ion capable of reacting with the manganese sulfide to form an insoluble semiconductor sulfide of said metal; and
   d. metal plating the surface of said printed circuit board base material by passing a current between said circuit board base material and an electrode immersed in an electrolyte containing dissolved copper.

39. The method of claim 38 where the alkaline permanganate solution has a pH in excess of 10.

40. The method of claim 39 where the pH exceeds 13.

41. The method of claim 39 where the permanganate solution is a solution of potassium permanganate.

42. The method of claim 38 where the solution used to form the manganese sulfide is a solution of an aqueous soluble metal sulfide salt.

43. The method of claim 38 where the solution used to form the manganese sulfide is a solution of an alkali or alkaline earth metal sulfide in a concentration of from 1 to 15 grams per liter of solution.

44. The method of claim 38 where the solution used to form the sulfide is a solution of a Group I A, I B or Group VIII metal of the Periodic Chart of the Elements.

45. The method of claim 38 where the solution used to form the sulfide is a solution of an iron, cobalt, nickel or copper salt.

46. The method of claim 38 where the solution used to form the sulfide is a solution of a copper salt.

47. The method of claim 38 where the article is plated with copper.

48. A method for manufacture of a printed circuit board starting from a printed circuit board base material comprising a copper clad phenolic or epoxy sheet having holes passing through the sheet at selected locations, said method comprising the steps of:
 a. treating the surface of said printed circuit board base material with an alkaline solution of a permanganate,
 b. treating the surface of said printed circuit board base material with a solution containing a dissolved sulfide capable of reacting with the permanganate treated surface to form a manganese sulfide,
 c. treating the surface of said printed circuit board base material with a solution of a dissolved Group I A, I B or Group VIII metal ion capable of reacting with the manganese sulfide to form a semiconductor sulfide of said metal;
 d. applying a photoresist over the surface of the copper cladding and exposing and developing said photoresist to form a pattern over said copper cladding; and
 e. metal plating the surface of said printed circuit board base material by passing a current between said circuit board base material and an electrode immersed in an electrolyte containing dissolved copper.

49. The method of claim 48 where the alkaline permanganate solution has a pH in excess of 10.

50. The method of claim 39 where the alkaline permanganate solution is a potassium permanganate solution having a pH that exceeds 13.

51. The method of claim 48 where the solution used to form the manganese sulfide is a solution of an aqueous soluble metal sulfide salt.

52. The method of claim 48 where the solution used to form the manganese sulfide is a solution of an alkali or alkaline earth metal sulfide in a concentration of from 1 to 100 grams per liter of solution.

53. The method of claim 48 where the solution used to form the sulfide is a solution of a Group I A, I B or Group VIII B metal of the Periodic Chart of the Elements.

54. The method of claim 48 where the solution used to form the sulfide is a solution of an iron, cobalt, nickel or copper salt.

55. The method of claim 48 where the solution used to form the sulfide is a solution of a copper salt.

56. The method of claim 48 where the article is plated with copper.

57. The method of claim 48 including a step of coating electroplated copper with an etch resist.

58. The method of claim 57 including the steps of stripping the photoresist from the copper and etching said circuit board to remove copper cladding exposed by removal of said photoresist.

* * * * *